United States Patent
Wang

(10) Patent No.: US 7,025,848 B2
(45) Date of Patent: Apr. 11, 2006

(54) HEAT SINK FOR CHIP PACKAGE AND BONDING METHOD THEREOF

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 67 days.

(21) Appl. No.: 10/605,602

(22) Filed: Oct. 13, 2003

(65) Prior Publication Data

US 2004/0118500 A1    Jun. 24, 2004

(30) Foreign Application Priority Data

Dec. 24, 2002    (TW) .............................. 91137108 A

(51) Int. Cl.
  *B29C 65/50*    (2006.01)
  *B32B 37/04*    (2006.01)
  *B32B 38/04*    (2006.01)
  *H05K 7/20*    (2006.01)

(52) U.S. Cl. ................... 156/256; 156/267; 156/308.2; 165/73; 361/710; 361/718

(58) Field of Classification Search ................. 156/60, 156/250, 256, 267, 307.3, 308.2, 309.6; 165/72–74, 165/79, 185, DIG. 515, 80.1–80.3; D13/179; 257/706, 707, 704, 712, 718, 719; 361/600, 361/704, 710, 717–720, 707, 679, 688

See application file for complete search history.

(56) References Cited

U.S. PATENT DOCUMENTS 5,881,945 A * 3/1999 Edwards et al. ......... 228/124.6
5,909,056 A * 6/1999 Mertol ....................... 257/704

* cited by examiner

*Primary Examiner*—Chris Fiorilla
*Assistant Examiner*—Sing P. Chan
(74) *Attorney, Agent, or Firm*—Jiang Chyun IP Office

(57) ABSTRACT

A method for bonding a heat sink to a chip package structure is disclosed. The chip package structure at least comprises a chip and a stiffener ring around the chip. Both the chip and the stiffener ring are set up on a substrate. The heat sink comprises a first protruding section located at a position corresponding to the chip and a plurality of second protruding sections located at positions corresponding to the stiffener ring. The method includes forming a gluing layer on the first protruding section and the second protruding sections of the heat sink and pressing the heat sink against the chip package structure to bond the heat sink and the chip package together. The first protruding section of the heat sink is attached to the chip and the second protruding sections are attached to the stiffener ring.

7 Claims, 3 Drawing Sheets

HEAT SINK FOR CHIP PACKAGE AND BONDING METHOD THEREOF

CROSS REFERENCE TO RELATED APPLICATIONS

This application claims the priority benefit of Taiwan application serial no. 91137108, filed Dec. 24, 2002.

BACKGROUND OF INVENTION

1. Field of the Invention

The present invention relates to a chip packaging process. More particularly, the present invention relates to a heat sink and a method of bonding the heat sink to form a chip package.

2. Description of the Related Art

In semiconductor production, the manufacturing of integrated circuits (IC) can be divided into three different stages, namely, a wafer fabrication stage, an integrated circuit fabrication stage and an IC packaging stage. Each die is produced after conducting a series of operations including, for example, wafer fabrication, circuit design, mask production and wafer sawing. After dicing up a wafer, contacts on the die are electrically connected to external points for intercommunicating with external devices. Thereafter, a molding material is used to enclose the die and produce a package so that the die is protected from moisture, heat and electrical interference while providing a means for connecting the die with an external circuit.

As the level of integration of integrated circuit increases, a variety of packaging methods for enclosing the chip have been developed. Because the so-called flip chip technology is able to reduce chip package area and shorten overall transmission path for signals, it has been widely adopted in the production of chip packages including chip scale packages (CSP), direct chip attach (DCA) packages and multi-chip module (MCM) packages.

To increase the dissipation of heat from a chip, a heat sink is normally attached to the backside of the chip using thermal conductive glue after the chip is electrically connected to the substrate via bumps. Furthermore, to increase the overall area and area of attachment of the heat sink and to position the heat sink more accurately, an additional stiffener ring is often attached to the substrate surrounding the chip. In other words, the stiffener ring is able to increase the heat-dissipating area of the heat sink and therefore its cooling capacity.

Conventionally, the heat sink is attached to the backside of the chip and the stiffener ring via a spot gluing process. In the spot gluing process, glue is applied to the backside of the chip and the stiffener ring before attaching the heat sink. Thereafter, a curing operation is performed to lock the heat sink and the backside of the chip tightly together. However, in the attachment process, the glue is applied to the backside of the chip and the stiffener ring separately. Since a longer time is required to complete the operation, overall yield can hardly improve.

SUMMARY OF INVENTION

Accordingly, one object of the present invention is to provide a heat sink for a chip package and a bonding method thereof capable of attaching the heat sink to a chip and a stiffener ring on a substrate quickly to increase productivity.

Another object of this invention is to provide a heat sink for a chip package and a bonding method thereof capable of increasing the bonding strength between the heat sink and the associated chip package.

To achieve these and other advantages and in accordance with the purpose of the invention, as embodied and broadly described herein, the invention provides a method of bonding a heat sink to a chip package structure. The chip package structure at least comprises a chip and a stiffener ring around the chip. The chip and the stiffener ring are set on a substrate. The heat sink has a first protruding section that corresponds with the chip and a plurality of second protruding sections that correspond with the stiffener ring. The method includes forming a gluing layer on the first protruding section and the second protruding section of the heat sink and then attaching the heat sink to the chip package structure. Hence, the first protruding section of the heat sink bonds with the chip while the second protruding section of the heat sink bonds with the stiffener ring.

The gluing layer is formed on the first protruding section and the second producing section of the heat sink through the following steps. First, a gluing tape having a shape and cutting pattern that matches the first protruding section and the second protruding section is provided. Thereafter, the first protruding section and the second protruding section of the heat sink are aligned with the cutting pattern of the guiding tape. The heat sink is disposing onto the guiding tape before detaching from the guiding tape. Hence, a layer of the guiding tape is imprinted on the first and the second protruding section of the heat sink.

This invention provides a heat sink for bonding with a chip package structure. The chip package structure at least comprises a chip and a stiffener ring around the chip. Both the chip and the stiffener ring are set on a substrate. The heat sink comprises a planar section, a first protruding section and a plurality of second protruding sections. The first protruding section is set on one of the surfaces of the planar section. The first protruding section is located in an area that corresponds to the chip. The second protruding sections are also set on the same surface of the planar section as the first protruding section. However, the second protruding sections are located in an area that corresponds to the stiffener ring.

This invention also provides a chip package structure comprising a substrate, a chip, a stiffener ring, a heat sink and a gluing layer. The chip is electrically connected to the substrate via a plurality of bumps. The stiffener ring is set over the substrate around the chip. The heat sink comprises a first protruding section and a plurality of second protruding sections. The first protruding section of the heat sink attaches to the chip while the second protruding sections of the heat sink attach to the stiffener ring. The gluing layer is disposed between first protruding section and the chip as well as between the second protruding sections and the stiffener ring.

Since the heat sink with protruding sections that are located at positions corresponding to the chip of the package structure and the stiffener ring is used, and therefore a gluing tape with cutting pattern can be adhered to the protruding section easily. Hence, there is no need to apply the conventional time-consuming spot gluing method. In other words, bonding the heat sink to the chip and the stiffener ring is quick and easy, thereby increasing overall productivity.

Furthermore, area of contact between the protruding section of the heat sink and the stiffener ring of the chip package is smaller by design. Hence, the unit pressure in the contact area between the heat sink and the stiffener ring when they are pressed together in the bonding process is increased.

That means, the bonding strength between the heat sink and the chip package structure will increase correspondingly.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
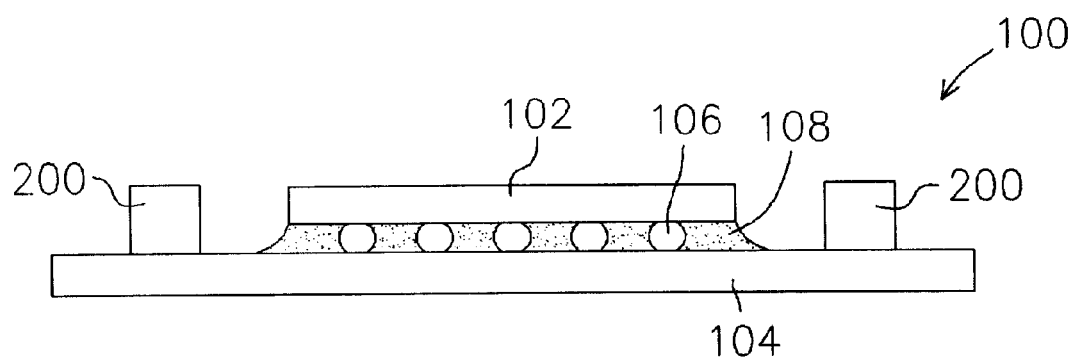
FIG. 1 is a side view of a chip package structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a side view of a chip package structure according to one preferred embodiment of this invention. As shown in FIG. 1, the chip package structure 100 comprises a chip 102, a substrate 104, a plurality of bumps 106, some underfill material 108 and a stiffener ring 200. The chip 102 and the substrate 104 are electrically connected through the bumps 106 attached to chip contacts (not shown) on the chip and the substrate contacts (not shown) on the substrate. The underfill material 108 fills the space between the chip 102 and the substrate 104 so that the bumps 106 are enclosed. This not only reduces the stress between the chip 102 and the substrate 104, but also prevents any impurities from passing into the area between the chip 102 and the substrate 104 to cause unwanted short circuit. The stiffener ring 200 is positioned on the substrate 104 to stabilize a subsequently attached heat sink and expand the heat-dissipating area so that the heat sink has a better cooling capacity.

Figure 2:
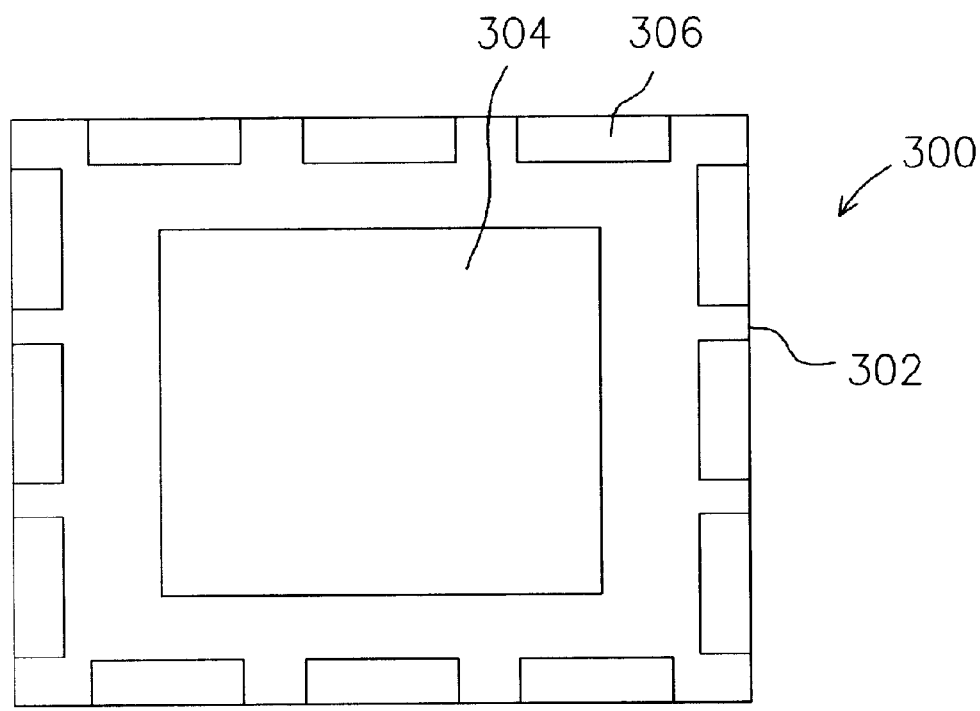
FIG. 2 is a diagram showing a top and a side view of a heat sink for a chip package according to one preferred embodiment of this invention.
Figure 2:
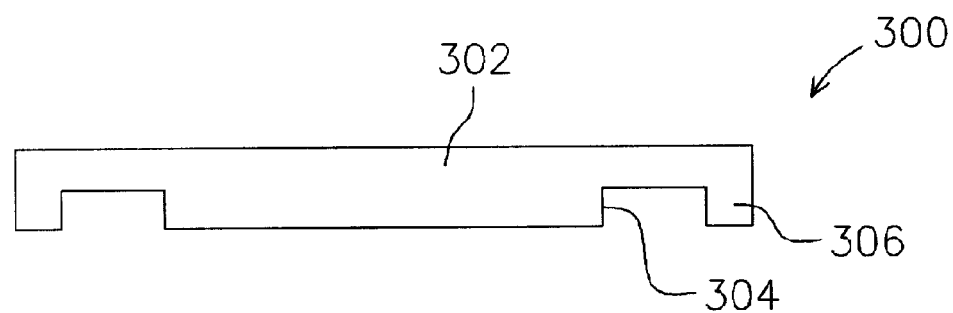

FIG. 2 is a diagram showing a top and side view of a heat sink for a chip package according to one preferred embodiment of this invention. As shown in FIG. 2, the heat sink 300 comprises a planar section 302, a first protruding section 304 and a plurality of second protruding sections 306. The first protruding section 304 is set on one of the surfaces of the planar section 302. The location and shape of the first protruding section 304 is designed to correspond with the location and shape of the chip 102 on the chip package structure 100 as shown in FIG. 1. Similarly, the second protruding sections 306 are set on the same surface of the planar section 302 as the first protruding section 304. The location of the second protruding sections 306 are designed to correspond with the location of the stiffener ring 200 of the chip package structure 100 as shown in FIG. 1. Furthermore, the sum area of all the second protruding sections 306 is designed to be smaller than the stiffener ring 200. When the heat sink 300 is bonded to the chip package structure 100, the first protruding section 304 is attached to the backside of the chip 102 and the second protruding sections 306 are attached to the stiffener ring 200. The heat sink 300 is fabricated using copper, for example. Preferably, the first protruding section 304 and the second protruding sections are fabricated into an integral part of the heat sink 300.

Figure 3:
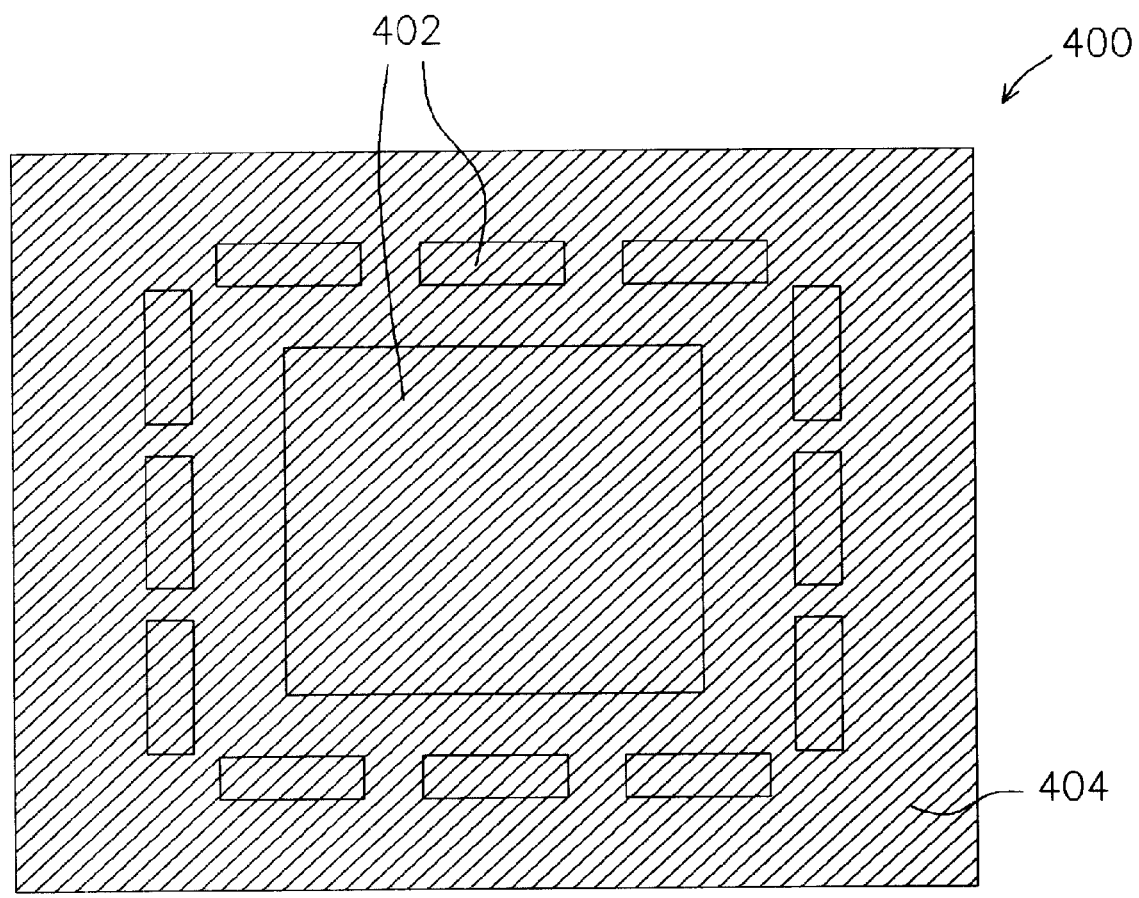
FIG. 3 is a top view of a gluing tape according to one preferred embodiment of this invention.

FIG. 3 is a top view of a gluing tape according to one preferred embodiment of this invention. As shown in FIG. 3, the gluing tape 400 is a double-sided adhesive tape fabricated using a material with good thermal conductivity and heat-softening capability or a partially polymerized B-stage gluing film. In one embodiment of this invention, the gluing tape 400 has a pre-formed cutting pattern 402 that corresponds with the shape and location of the first protruding section 304 and the second protruding sections 306 of the heat sink 300. Furthermore, the first cutting pattern 402 and another cutting pattern 404 are set to remain in the fixed cutting configuration on a backing paper sheet 406.

Figure 4:
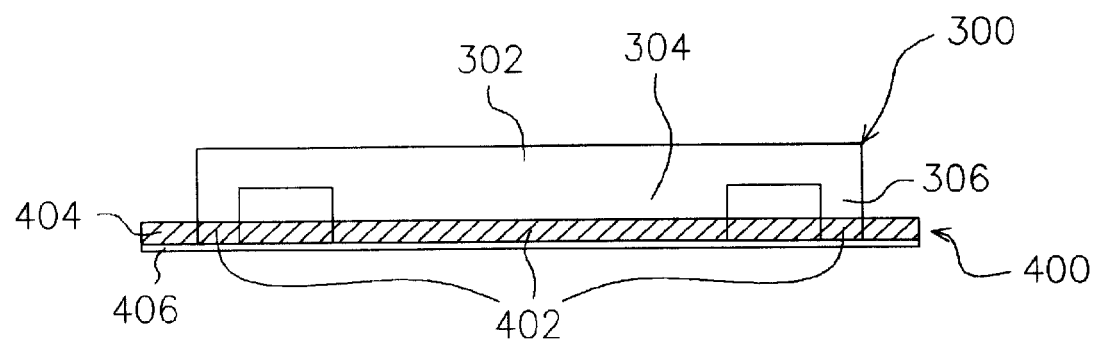
FIGS. 4 and 5 are diagrams showing the process of forming a gluing layer on the protruding sections of a heat sink according to this invention.
Figure 5:
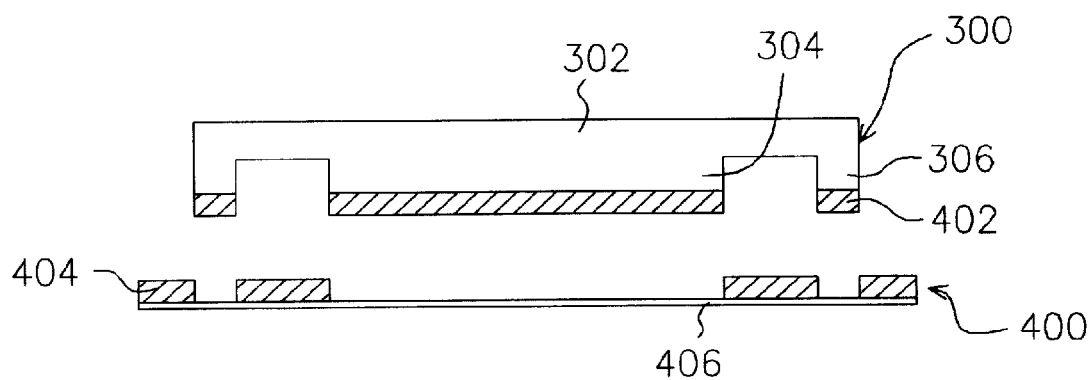

FIGS. 4 and 5 are diagrams showing the process of forming a gluing layer on the protruding sections of a heat sink according to this invention. As shown in FIG. 4, the first protruding section 304 and the second protruding sections 306 of the heat sink 300 is aligned to the first cutting pattern 402 of the gluing tape 400. Thereafter, the heat sink is disposed onto the gluing tape 400. Hence, the first protruding section 304 and the second protruding sections 306 of the heat sink 300 are attached to the surfaces of the first cutting pattern 402 of the gluing tape 400.

As shown in FIG. 5, the heat sink 300 is detached from the gluing tape 400. Since the gluing tape 400 has already been cut to produce the first cutting pattern 402 and the second cutting pattern 404, the gluing tape 400 within the first cutting pattern 402 will detach from the back paper sheet 406. The gluing tape 400 within the first cutting pattern 402 adheres to the first protruding section 304 and the second protruding sections 306 while the gluing tape within the second cutting pattern remains behind on the backing paper sheet 406. In other words, the gluing layer 402 on the heat sink 300 is formed in the same process.

Figure 6:
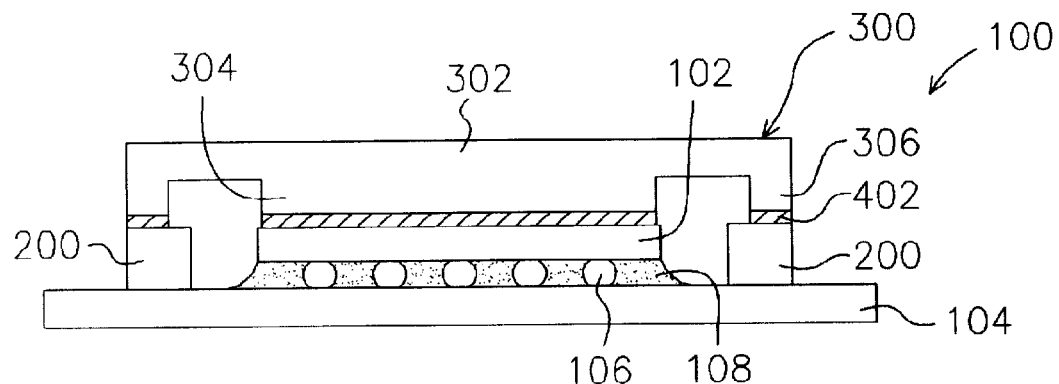
FIG. 6 is a side view showing a heat sink with a gluing layer bonded to the chip package structure as shown in FIG. 1.

FIG. 6 is a side view showing a heat sink with a gluing layer bonded to the chip package structure as shown in FIG. 1. As shown in FIG. 6, the heat sink 300 with the gluing layer 402 on various protruding sections is attached to the chip package structure 100 with the first protruding section 304 positioned over the backside of the chip 102 and the second protruding sections 306 positioned over the stiffener ring 200. Thereafter, the gluing layer 402 is cured through heating and the application of pressure so that the heat sink 300 is firmly bonded to the chip package structure 100, and a chip package structure 100 with heat sink 300 is formed as shown in FIG. 6. Because the second protruding sections 306 are designed to have a smaller contact area with the stiffener ring 200, pressure on unit area during the curing process is higher. Consequently, the heat sink 300 can be more firmly attached to the chip package structure.

In the aforementioned embodiment, a heat sink with protruding sections is pressed against a gluing tape with a corresponding pre-formed cutting pattern so that a gluing layer is formed on the heat sink in one step. However, the scope of this invention is not limited as such. For example, the protruding section may form on the stiffener ring and then a gluing tape with a corresponding cutting pattern may press against the chip packages structure. Thus, after the gluing tape is detached from the chip package structure, a gluing layer is formed on the backside of the chip and the stiffener ring concurrently. Furthermore, the application of this invention is not limited to a flip chip package but can be applied to other types of chip package structures as well.

In summary, this invention at least includes the following advantages: 1. Since the heat sink with protruding sections located at positions corresponding in position to the chip of the package structure and the stiffener ring is used, therefore a gluing tape with cutting pattern can be adhered to the protruding section easily. Hence, there is no need to apply the conventional time-consuming spot gluing method. In other words, bonding the heat sink to the chip and the stiffener ring is quick and easy, thereby increasing overall productivity. 2. Area of contact between the protruding sections of the heat sink and the stiffener ring of the chip package structure are smaller by design. Hence, the pressure in the contact area between the heat sink and the stiffener ring when they are pressed together in the bonding process is increased. That means, the ultimate bonding strength between the heat sink and the chip package structure will increase correspondingly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of bonding a heat sink to a chip package structure, wherein the chip package structure at least comprises a chip and a stiffener ring around the chip with the stiffener ring set up over a substrate, and the heat sink comprises a first protruding section located at a position corresponding to the chip and a plurality of second protruding sections located at positions corresponding to the stiffener ring, the method comprising the steps of:

providing a gluing tape, wherein the gluing tape comprises a cutting pattern with a shape that matches with the first protruding section and the second protruding sections of the heat sink;

aligning the first protruding section and the second protruding section of the heat sink with the cutting pattern and disposing the hear sink onto the gluing tape;

detaching the heat sink from the gluing tape so that a portion of the gluing tape remains adhered to the first and the second protruding sections to form the gluing layer; and bonding the heat sink to the chip package structure such that the first protruding section of the heat sink is attached to the chip and the second protruding sections of the heat sink are attached to the stiffener ring.

2. The method of claim 1, wherein the gluing tape comprises a heat-softening double-sided adhesive tape.

3. The method of claim 1, wherein the gluing tape comprises a partially polymerized B-stage adhesive film.

4. The method of claim 1, wherein a material constituting the heat sink comprises copper.

5. The method of claim 1, wherein the first protruding section and the second protruding sections are formed together with the heat sink into an integral unit.

6. The method of claim 1, wherein the sum area of all the second protruding sections is less than the area of the stiffener ring.

7. The method of claim 1, wherein the step of bonding the heat sink to the chip package structure further comprises performing a curing operation.

* * * * *